United States Patent
Amoriza Berasaluce et al.

(10) Patent No.: US 7,619,206 B2
(45) Date of Patent: Nov. 17, 2009

(54) TACTILE SWITCH FOR A DOMESTIC APPLIANCE HAVING A CONTROLLER CAUSING A RADIATION EMITTER AND AN AUXILIARY RADIATION EMITTER TO EMIT RADIATION FOR A DURATION OF TIME

(75) Inventors: Jose Miguel Amoriza Berasaluce, Galdakao (ES); Gonzalo Fernández Llona, Elorrio (ES); Eider Landa Oñate, Bergara (ES); Eneko Muguerza Murgizu, Igorre (ES)

(73) Assignee: Eika, S. Coop, Etxebarria (Bizkaia) (ES)

( * ) Notice: Subject to any disclaimer, the term of this patent is extended or adjusted under 35 U.S.C. 154(b) by 0 days.

(21) Appl. No.: 12/187,309

(22) Filed: Aug. 6, 2008

(65) Prior Publication Data
US 2009/0039239 A1    Feb. 12, 2009

(51) Int. Cl.
G01J 1/36    (2006.01)
(52) U.S. Cl. .................... 250/227.22; 250/221
(58) Field of Classification Search ............ 250/227.22, 250/221, 227.21, 551, 239; 200/61.02, 51.11, 200/51.12, 512, 520–523
See application file for complete search history.

(56) References Cited

U.S. PATENT DOCUMENTS 5,319,205 A * 6/1994 Kline et al. ............ 250/363.04
2006/0282070 A1   12/2006 Arnold

* cited by examiner

Primary Examiner—Que T Le
(74) Attorney, Agent, or Firm—Tim L. Kitchen; Peter B. Scull; Berenbaum Weinshienk PC

(57) ABSTRACT

A switch for a domestic appliance, such as a cooking range, that includes a radiation emitter, an auxiliary radiation emitter and a radiation receiver, the radiation receiver adapted to receive at least part of the radiation emitted from the radiation emitter and auxiliary radiation emitter and to generate one or more reception signals whose values depend on the radiation received. A controller associated with the switch generates a periodic control pulse (Pc) at a first time interval to cause the radiation emitter to emit radiation for a duration of time and a periodic test pulse (Pt) at a second time interval different than the first time interval to cause the auxiliary radiation emitter to emit radiation for a duration of time. The controller configured to evaluate the one or more reception signals to determine if an error or malfunction exists in the switch.

20 Claims, 5 Drawing Sheets

US 7,619,206 B2

TACTILE SWITCH FOR A DOMESTIC APPLIANCE HAVING A CONTROLLER CAUSING A RADIATION EMITTER AND AN AUXILIARY RADIATION EMITTER TO EMIT RADIATION FOR A DURATION OF TIME

CROSS-REFERENCE TO RELATED APPLICATIONS

This application claims priority to Spanish Patent Application ES-P200702211, filed Aug. 6, 2007.

TECHNICAL FIELD

The present invention relates to a tactile switch, and more specifically to a tactile switch used in domestic appliances, such as a cooking appliance.

BACKGROUND

Contact switches are widely used in domestic appliances, such as cooking appliances. The contact switches are disposed beneath a cover on the appliance and a user acts on them by exerting pressure on or pressing the cover, the pressing action being detected thanks to the contact switches.

Different types of contact switches, such as capacitive or optical switches, are known. In optical switches an optical sensor is disposed beneath the cover, the optical sensor generally comprising a radiation emitter that emits radiation (light) and a receiver that may receive at least part of the radiation emitted by the emitter. When a user exerts pressure on the cover that covers the switch, the radiation emitted by the emitter that the receiver receives varies, the pressing action being detected.

In conventional optical switches it is not possible to detect if the optical sensor is working correctly or not, which could cause serious safety problems. If the switch is activated and this is not detected by the optical sensor, this is extremely serious, the result being that the deactivation of the switch is not detected when the user presses it again. For example, United States Patent Application published as US2006/0282070A1 discloses the use of an evaluation circuit for evaluating the functioning of the optical sensor and thereby identify any faults in it, the circuit enabling the evaluation of the value of an input signal in a microprocessor for a preset period of time. The period is divided into a first and a second time interval, the values of the input signal being obtained in one or the other interval. Thus, in the first interval the value mainly depends on the radiation emitted by a light emitter whereas in the second interval it mainly depends on a signal emitted by the microprocessor itself.

SUMMARY OF THE DISCLOSURE

It is an object of the invention to provide a tactile switch as described in the claims.

The tactile switch of the invention is used in domestic appliances. In one embodiment, the switch comprises an optical sensor that comprises at least a radiation emitter and reception means/radiation receiver adapted to receive at least part of the emitter radiation emitted by the emitter and which generates at least a reception signal, the value of which depends on the radiation received, and a controller/control means for evaluating the reception signal.

The optical sensor also comprises an auxiliary radiation emitter and the reception means/radiation receiver is also adapted to receive at least part of the auxiliary emitter radiation emitted by the auxiliary emitter, the reception signal generated by the reception means/radiation receiver also depending on the auxiliary emitter radiation received from the auxiliary emitter. The controller/control means generates a periodic control pulse so that the emitter may emit emitter radiation, and a periodic test pulse so that the auxiliary emitter may emit auxiliary emitter radiation, the controller/control means generating the pulses during different time intervals so that they do not coincide.

In this way, depending on the reception signal, the controller/control means may determine if the switch has been pressed or not depending on the emitter radiation received by the reception means/radiation receiver, and whether the optical sensor is malfunctioning or not depending on the auxiliary emitter radiation received by the reception means/radiation receiver.

Thus, it is possible to determine whether the optical sensor is malfunctioning or not, thereby reducing the risk of a fault not being detected when the switch is pressed to activate a function such as, for example, the switching on of a burner on a cooking appliance. In this case, if a fault is detected in the switch the function can be switched off automatically without having to wait for the switch to be pressed again, which in this case would also be impossible to detect.

These and other advantages and characteristics of the invention will be made evident in the light of the drawings and the detailed description thereof.

DETAILED DESCRIPTION

Figure 1:
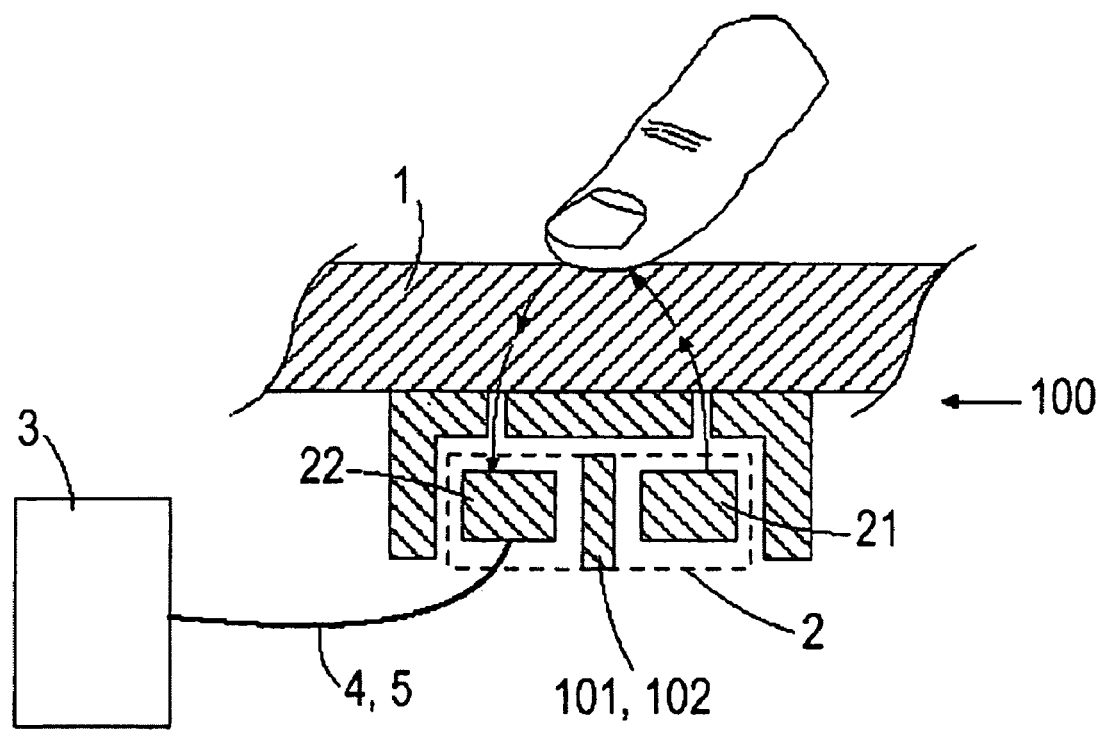
FIG. 1 is a cross-sectional view of a switch in an embodiment of the present invention.

FIG. 1 shows a tactile switch 100 in an embodiment of the present invention. The switch 100 comprises a cover 1 on which a user touches or otherwise exerts pressure, generally with their finger, in order to press the switch 100, and preferably an optical sensor 2 disposed beneath the cover 1 and a controller/control means 3 that may comprise, for example, a microcontroller, which may determine if the switch 100 has been pressed or not depending on at least a reception signal 4, 5 generated by the optical sensor 2. The optical sensor 2 comprises at least a radiation emitter 21 and reception means/radiation receiver 22 adapted to receive at least part of the emitter radiation emitted by the emitter 21 by reflection, the reception means/radiation receiver 22 generating the reception signal 4, 5 that reaches the controller/control means 3, the value of which depends on the radiation it receives.

Part of the emitter radiation emitted by the emitter 21 is reflected on the cover 1 and the rest passes through the cover 1, with only the light that is reflected on the cover 1 reaching the reception means 22. When a user acts on the switch 100 by pressing or touching the cover 1, at least part of the light that passes through the cover 1 is reflected on the finger of the user and reaches the reception means 22, the reception signal 4, 5 generated by the reception means 22 thereby being modified and the control means 3 detecting the pressing action thanks to the reception signal 4, 5.

Figure 2:
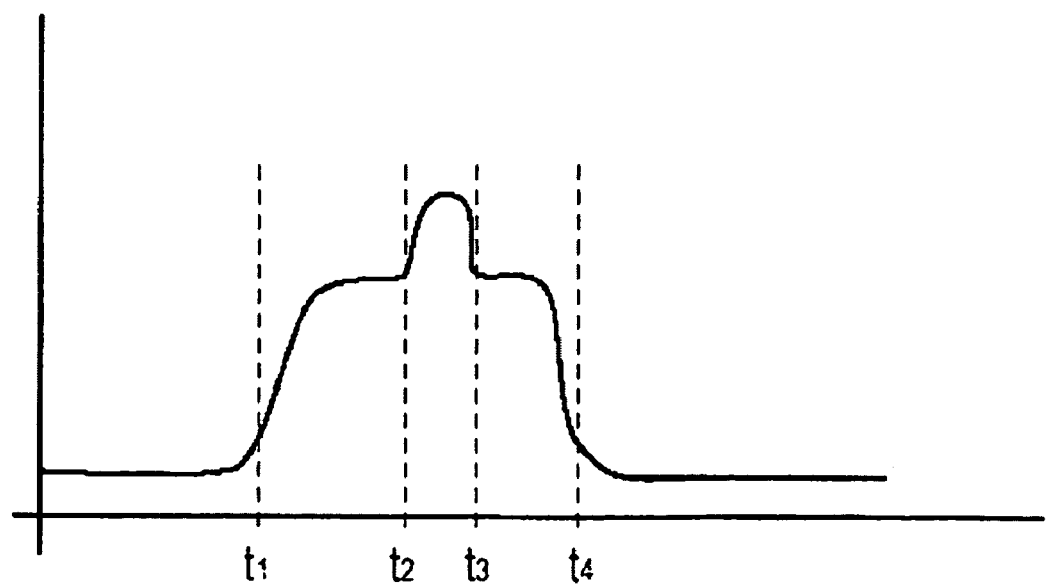
FIG. 2 shows a reception signal in normal lighting conditions.

FIG. 2 shows an embodiment of the reception signal 4, 5 in normal lighting conditions when a user presses or touches the switch 100 during a time interval t1-t4 with their finger, for example. Up to the instant t1 and from the instant t4, time intervals in which a user does not press the switch 100, part of the emitter radiation emitted by the emitter 21 is reflected on the cover 1 and the vast majority of it passes through the cover 1 and is not reflected, the reflected part being detected by the detection means 22. In this situation, the controller/control means 3 does not detect any pressing of the switch 100. During the time intervals t1-t2 and t3-t4, the user's finger moves towards the cover 1 of the switch 100 (or away from it) reflecting part of the radiation that passes through the cover 1 on it, the radiation reaching the reception means 22. The interval t2-t3 corresponds with the time interval during which the finger presses down on the cover 1 of the switch 100, a large part of the radiation that passes through the cover 1 being reflected on the finger and reaching the reception means 22. When receiving a reception signal 4, 5 of these characteristics, the control means 3 detects that the switch 100 has been pressed.

Figure 3:
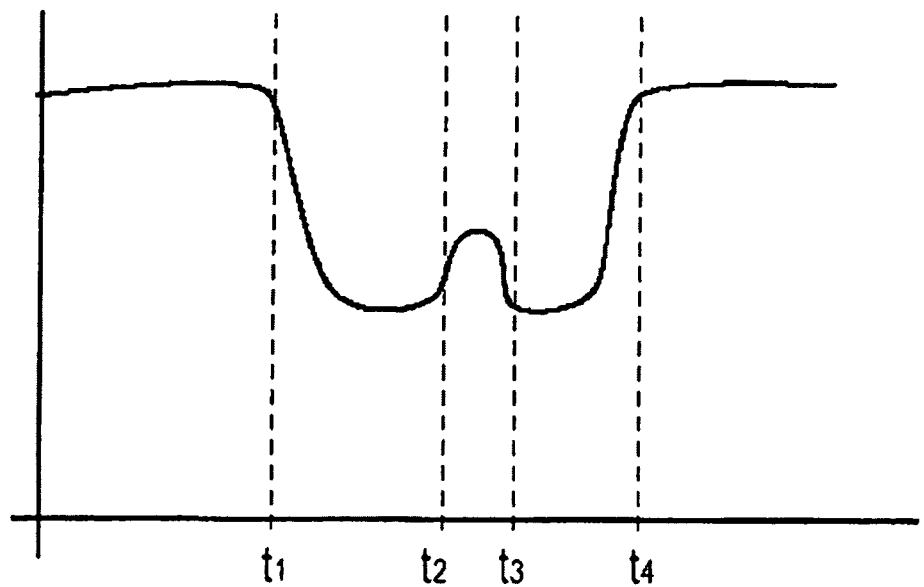
FIG. 3 shows a reception signal when the reception means/radiation receiver receives a lot of radiation from an external source.

FIG. 3 shows an embodiment of the reception signal 4 when the reception means/radiation receiver 22 receives a lot of radiation from an external source, such as fluorescent or solar radiation, for example. Up to the instant t1 and from the instant t4, the reception means 22 generate a reception signal 4 with great intensity (or maximum intensity) as they are receiving a lot of radiation, a sign that may indicate a saturation of the reception means 22. During the intervals t1-t2 and t3-t4, the user's finger moves towards the cover 1 of the switch 100 (or away from it) and blocks at least part of the external radiation, all or a portion of the radiation not reaching the reception means 22, the reception means 22 being reached by the emitter radiation emitted by the emitter 21 that is reflected on the cover 1 and the part of the emitter radiation emitted by the emitter 21, which, after passing through the cover 1 is reflected on the finger. The interval t2-t3 corresponds with the time interval during which the finger exerts pressure on or presses down the switch 100, a large part of the emitter radiation emitted by the emitter 21 being reflected on the finger, and with the reception means 22 only being reached by the reflected radiation, this being detected by the control means 3.

Figure 4:
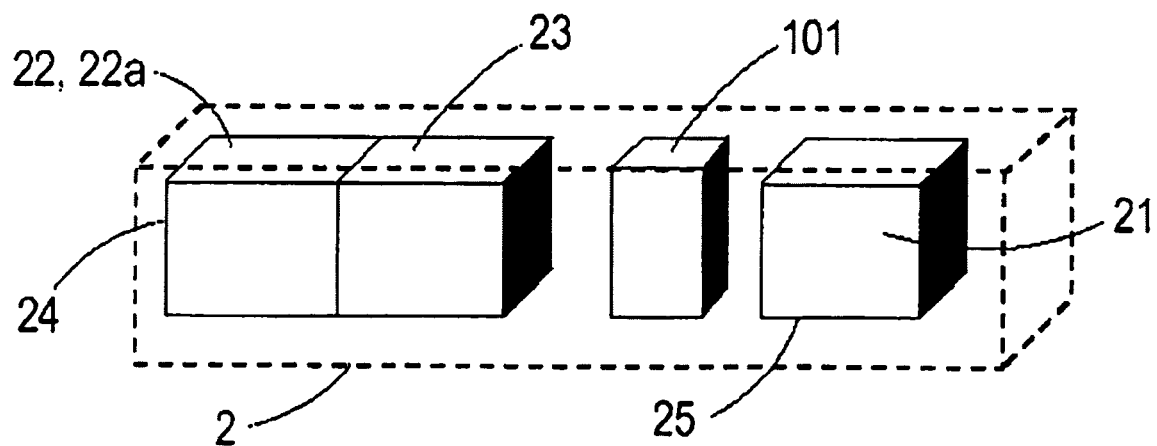
FIG. 4 is a perspective view of a switch in an embodiment of the present invention.
Figure 5:
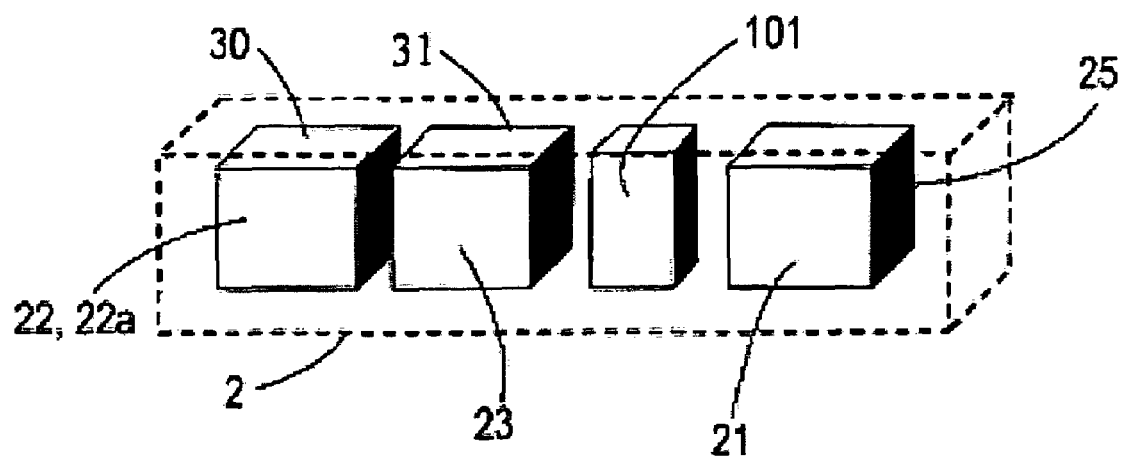
FIG. 5 is a perspective view of a switch in another embodiment of the present invention.
Figure 6:
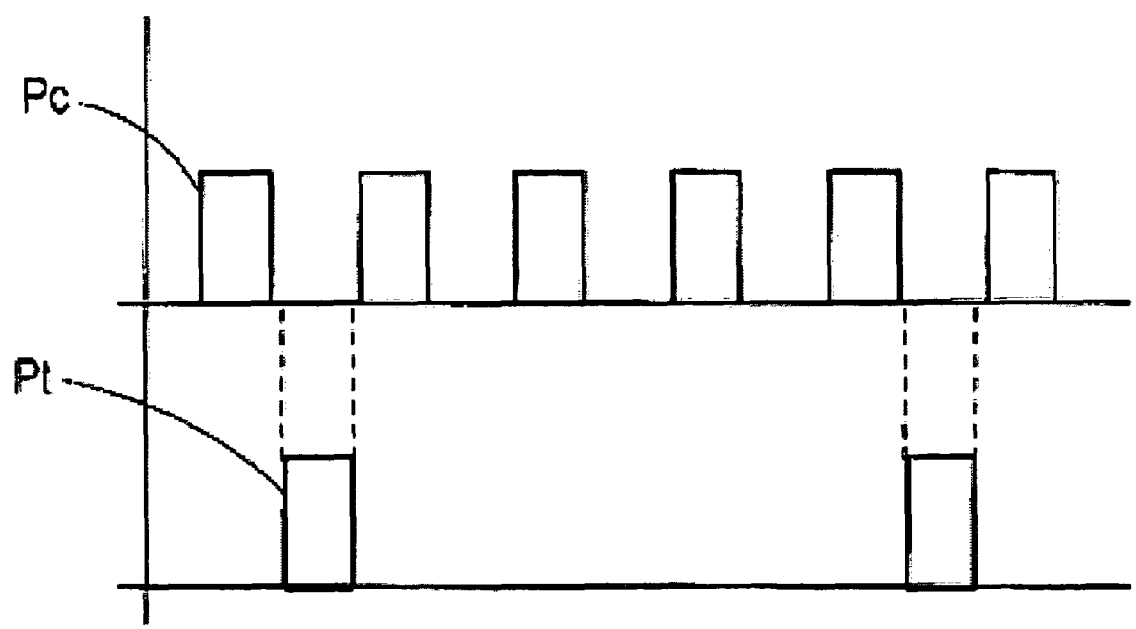
FIG. 6 shows the control and test pulses generated by the controller/control means of a switch in an embodiment of the present invention.
Figure 7:
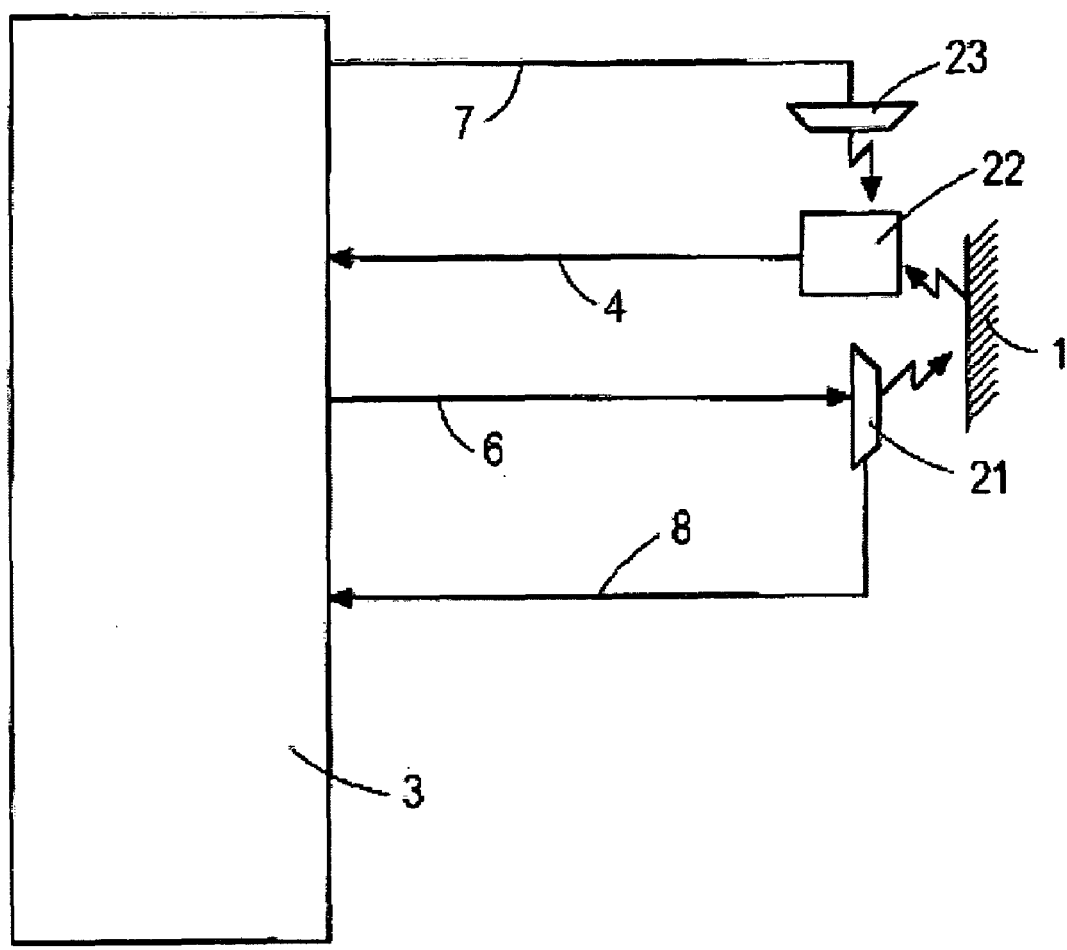
FIG. 7 schematically shows the switches of FIG. 4 and FIG. 5.

The optical sensor 2 of the switch 100 of the invention also comprises an auxiliary radiation emitter 23, shown in FIGS. 4 and 5, which is preferably adapted to emit auxiliary emitter radiation directly towards the reception means 22. Through an emitter signal 6 the controller/control means 3 transmits a periodic control pulse Pc (See FIG. 6) to the emitter 21 shown in FIG. 7 so that the emitter 21 emits emitter radiation, and through an auxiliary emitter signal 7 the controller/control means 3 transmits a periodic test pulse Pt (See FIG. 6) to the auxiliary emitter 23, as shown in FIG. 7, so that the auxiliary emitter 23 emits auxiliary emitter radiation, the pulses Pc and Pt being generated during different time intervals. Thus, the control pulses Pc and the test pulses Pt do not coincide, the control means 3 being capable of determining if the value of the reception signal 4, 5 corresponds with the emitter radiation emitted by the emitter 21 or with the auxiliary emitter radiation emitted by the auxiliary emitter 23.

When the value of the reception signal 4, 5 depends on the emission radiation emitted by the emitter 21, the control means 3 evaluates the reception signal 4, 5 to determine if the switch 100 has been pressed or not. When the control means 3 generates the test pulses Pt, the value of the reception signal 4, 5 depends on the auxiliary emission radiation emitted by the auxiliary emitter 23, and the control means 3 evaluates the reception signal 4, 5 to determine if the optical sensor 2 is malfunctioning or not. When the reception means 22 receive the auxiliary emitter radiation directly, they receive substantially all the radiation emitted by the auxiliary emitter 23 generating a reception signal 4, 5 with a high value. As a result, thanks to the value, the control means 3 may also determine if the reading is correct or not. Thus, in one embodiment in normal lighting conditions, when the auxiliary emitter 23 receives a test pulse Pt it generates auxiliary emitter radiation for a time interval preferably equal or substantially equal to the duration of the test pulse Pt, and the reception means 22 receives at least part of the radiation and generates the corresponding reception signal 4, which is received by the control means 3. If the reception means 22 malfunction, the reception signal 4 comprises a null value or a maximum value that corresponds with the saturation of the reception means 22 (in the event of the short-circuit of the reception means 22, for example), the control means 3 determining an error or malfunction in the optical sensor 2.

In one embodiment, the emitter 21 is also adapted to generate a safety signal 8, as shown in FIG. 7, that reproduces, at least in part, the control pulses Pc it receives. The safety signal 8 reaches the control means 3, the control means 3 being capable of evaluating the safety signal 8. Thus, if when a control pulse Pc is generated it does not receive a pulse through the safety signal 8, the control means 3 may determine that there is an error in the emitter, for example.

In the embodiments of FIGS. 4, 5 and 7, the reception means 22 comprises a single radiation receiver 22a. The receiver 22 and the auxiliary emitter 23 may be built into a single unit or element 24, as shown in FIG. 4, or into different elements 30 and 31 as shown in FIG. 5, the emitter 21 forming a single element 25 in both cases. The receiver 22 is adapted to receive at least part of the emitter radiation emitted by the emitter 21 by reflection and to receive part or substantially all the auxiliary emitter radiation emitted by the auxiliary emitter 23 directly, generating the reception signal 4 depending on the radiation it receives at each moment. For this reason, the switch 100 comprises, in one embodiment, at least an insulating element 101 disposed between the emitter 21, and the auxiliary emitter 23 and the receiver 22a. It is appreciated that switch 100 may comprise multiple radiation emitters and/or multiple auxiliary radiation emitters 23 and/or multiple radiation reception means 22.

Figure 8:
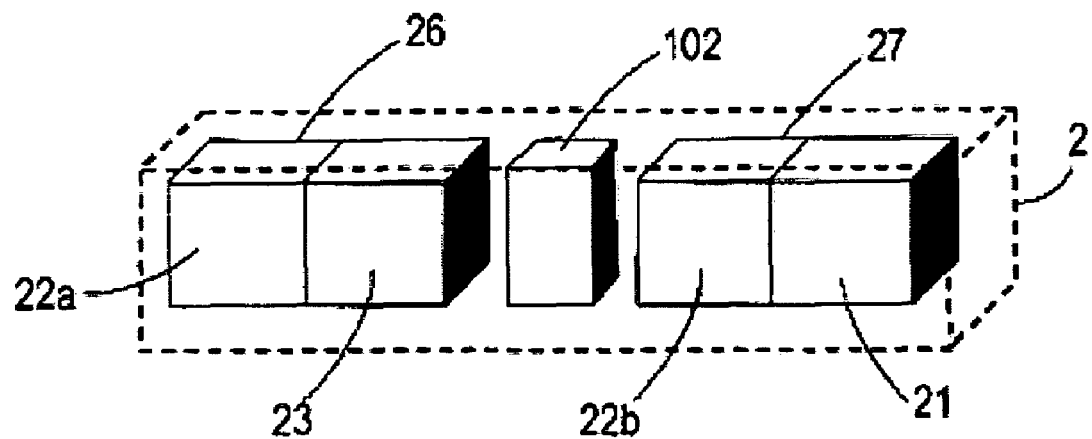
FIG. 8 is a perspective view of a switch in another embodiment of the present invention.
Figure 9:
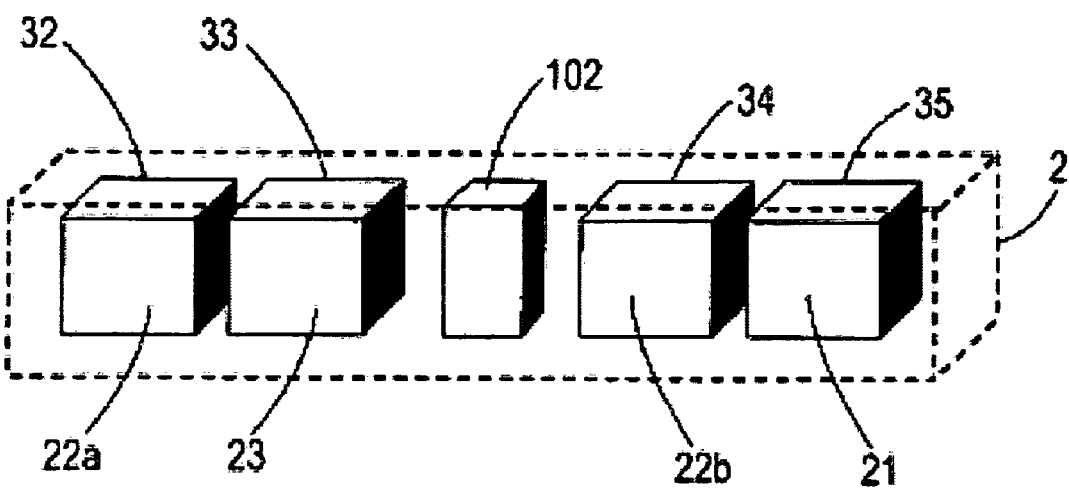
FIG. 9 is a perspective view of a switch in another embodiment of the present invention.
Figure 10:
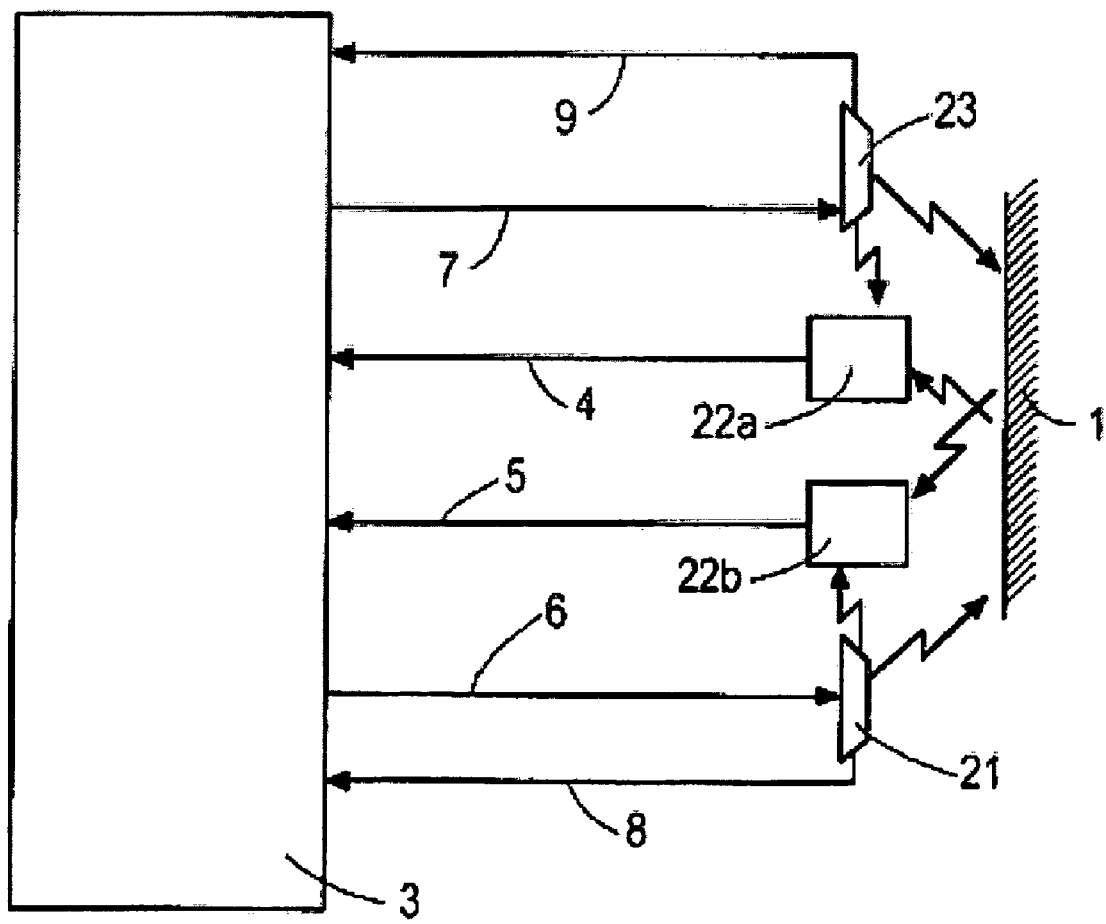
FIG. 10 schematically shows the switches of FIG. 8 and FIG. 9.

In the embodiments of the switch 100 shown in FIGS. 8 to 10 the reception means 22 comprises a radiation receiver 22a and an auxiliary radiation receiver 22b. The receiver 22a is adapted to receive at least part of the emitter radiation emitted by the emitter 21 by reflection and to receive part or substantially all the auxiliary emitter radiation emitted by the auxiliary emitter 23 directly, and the auxiliary receiver 22b is adapted to receive at least part of the auxiliary emitter radiation emitted by the auxiliary emitter 23 by reflection and to receive part or substantially all the emitter radiation emitted by the emitter 21 directly. For this reason, the switch 100 preferably comprises at least a second insulating element 102 disposed between the emitter 21 and the auxiliary receiver 22b, and the auxiliary emitter 23 and the receiver 22a. Each receiver 22a and 22b generates a reception signal 4 and 5 whose value depends on the radiation received by the corresponding receiver 22a, 22b, both reception signals 4 and 5 reaching the control means 3 which may determine that the switch 100 has been pressed, by means of both reception signals 4 and 5. In the second embodiment, the control means 3 transmits the control pulses Pc for the emitter 21 through the emitter signal 6 and the test pulse Pt for the auxiliary emitter 23 through auxiliary emitter signal 7, thereby determining if there is an error or not in the optical sensor 2 depending on the reception signals 4 and 5 received. In these embodiments the emitter 21 and the auxiliary receiver 22b may be built into a first single unit/element 27 of the optical sensor 2, and the auxiliary emitter 23 and the receiver 22a may be built into a second single unit/element 26 of the optical sensor 2 as shown in FIG. 8, or they may be independent to each other to form four elements 33, 34, 35 and 36 as shown in FIG. 9. In one embodiment, radiation emitter 21 and/or auxiliary radiation emitter 23 generate a safety signal 8 and 9, respectively, that reproduces the control pulses Pc and the test pulses Pt they receive, respectively. If the safety signals 8 and/or 9 reach the controller/control means 3, the control means 3 is capable of evaluating one or both of safety signals 8 and 9. Thus, if when a control pulse Pc or a test pulse Pt is generated it does not receive a pulse through the corresponding safety signal 8 and/or 9, the control means 3 may determine that there is an error in the emitter, for example. In alternative embodiments switch 100 comprises multiple radiation emitters 21 and/or multiple radiation receivers 22a and/or multiple auxiliary radiation emitters 23 and/or multiple auxiliary radiation receivers 22b.

In a brightly lit environment in which the reception means 22 receives a lot of radiation from an external source, such as solar radiation or radiation originating from a fluorescent light, the reception means 22 may be saturated generating a reception signal 4 and/or 5 corresponding with the saturation (the maximum possible value). In the event that the optical sensor 2 malfunctions (a malfunction in the receiver 22 for example), the reception signal 4 and/or 5 may be equal to that of the saturation due to a short in the radiation receiver, for example, the control means 3 being unable to distinguish between the malfunction and the saturation due to the high external radiation. In such a case, the control means 3 is adapted to evaluate whether the optical sensor 2 suffers a malfunction or not when the switch 100 is pressed. In the embodiments of FIGS. 4, 5 and 7, when the switch 100 is pressed in a brightly lit environment, if the optical sensor 2 malfunctions in a way that produces a maximum reception signal 4 (as a result of a short in radiation receiver 22a, for example) the control means 3 is not adapted to identify this type of error. In the embodiments of FIGS. 8 to 10, when switch 100 is pressed the pressing action may be determined by the control means 3 by means of both reception signals 4 and 5. Thus, if one of the elements 21, 22a, 22b, 23, 26 or 27 malfunctions (a malfunction in the optical sensor 2), the control means 3 may determine the malfunction as, by means of one of the reception signals 4 or 5, they will detect that the switch 100 has been pressed, thereby reducing the risk of a malfunction not being detected in the optical sensor 2, and consequently, in the switch 100. For example, in one embodiment, reception signals 4 and 5 are made to be equal or substantially equal when both receivers 22a and 22b are functioning properly. In such an embodiment, a malfunction of one or the other of receivers 22a or 22b is detectable by comparing the reception signals 4 and 5 to determine if the signals are equal.

What is claimed is:

1. A switch comprising:
   a radiation emitter,
   an auxiliary radiation emitter,
   a controller configured to generate a periodic control pulse (Pc) at a first time interval to cause the radiation emitter to emit radiation for a duration of time and to generate a periodic test pulse (Pt) at a second time interval different than the first time interval to cause the auxiliary radiation emitter to emit radiation for a duration of time,
   a radiation receiver, and
   a cover positioned over the radiation emitter, auxiliary radiation emitter and radiation receiver,
   the radiation receiver adapted to receive at least part of the radiation emitted by the radiation emitter and at least part of the radiation emitted by the auxiliary radiation emitter, the radiation receiver configured to generate one or more reception signals whose values depend on the radiation received,
   the controller configured to receive and evaluate the one or more reception signals to determine if the cover has been pressed by a user and/or to determine if a malfunction exists in the switch.

2. A switch according to claim 1 wherein the radiation emitter emits radiation for a duration of time substantially equal to the duration of the control pulse (Pc) and wherein the auxiliary radiation emitter emits radiation for a duration of time substantially equal to the duration of the test pulse (Pt).

3. A switch according to claim 1 wherein the radiation receiver is adapted to receive at least part of the radiation from the radiation emitter by reflection from the cover and to directly receive substantially all the radiation emitted from the auxiliary radiation emitter.

4. A switch according to claim 1 wherein the radiation received by the radiation receiver from the radiation emitter is reflected from the cover and/or a finger of a user and wherein the radiation received by the radiation receiver from the auxiliary radiation emitter is received directly from the auxiliary radiation emitter.

5. A switch according to claim 1 wherein the radiation emitter generates a safety signal which reproduces at least in part the control pulse (Pc) generated by the controller, the controller configured to receive and evaluate the safety signal to determine if a malfunction exists in the switch.

6. A switch according to claim 1 wherein the auxiliary radiation emitter and the radiation receiver are constructed as a single unit.

7. A switch according to claim 1 further comprising an auxiliary radiation receiver adapted to receive at least part of the radiation emitted by the radiation emitter and at least part of the radiation emitted by the auxiliary radiation emitter, the auxiliary radiation receiver configured to generate one or more reception signals whose values depend on the radiation received.

8. A switch according to claim 7 wherein the auxiliary radiation receiver is adapted to receive at least part of the radiation from the auxiliary radiation emitter by reflection from the cover and to directly receive substantially all the radiation emitted from the radiation emitter.

9. A switch according to claim 7 wherein the radiation received by the auxiliary radiation receiver from the auxiliary radiation emitter is reflected from the cover and/or a finger of a user and wherein the radiation received by the auxiliary radiation receiver from the radiation emitter is received directly from the radiation emitter.

10. A switch according to claim 7 wherein the radiation received by the radiation receiver from the radiation emitter is reflected from the cover and/or a finger of a user and wherein the radiation received by the radiation receiver from the auxiliary radiation emitter is received directly from the auxiliary radiation emitter and wherein the radiation received by the auxiliary radiation receiver from the auxiliary radiation emitter is reflected from the cover and/or a finger of a user and wherein the radiation received by the auxiliary radiation receiver from the radiation emitter is received directly from the radiation emitter.

11. A switch according to claim 7 wherein the radiation emitter and auxiliary radiation receiver are constructed as a single unit.

12. A switch according to claim 7 wherein the auxiliary radiation emitter and the radiation receiver are constructed as a single unit and wherein the radiation emitter and auxiliary radiation receiver are constructed as a single unit.

13. A switch according to claim 7 wherein the auxiliary radiation emitter generates a second safety signal which reproduces at least in part the test pulse (Pt) generated by the controller, the controller configured to receive and evaluate the second safety signal to determine if a malfunction exists in the switch.

14. A switch according to claim 7 wherein the radiation emitter generates a first safety signal which reproduces at least in part the control pulse (Pc) generated by the controller and wherein the auxiliary radiation emitter generates a second safety signal which reproduces at least in part the test pulse (Pt) generated by the controller, the controller configured to receive and evaluate the first and second safety signals to determine if a malfunction exists in the switch.

15. A domestic appliance comprising:
an optical sensor comprising a radiation emitter, an auxiliary radiation emitter and a radiation receiver, the radiation receiver adapted to receive at least part of the radiation emitted by the radiation emitter and at least part of the radiation emitted by the auxiliary radiation emitter, the radiation receiver configured to generate one or more reception signals whose values depend on the radiation received,
a cover positioned over the optical sensor, and
a controller configured to generate a periodic control pulse (Pc) at a first time interval to cause the radiation emitter to emit radiation for a duration of time and to generate a periodic test pulse (Pt) at a second time interval different than the first time interval to cause the auxiliary radiation emitter to emit radiation for a duration of time, the controller configured to receive and evaluate the one or more reception signals to determine if a user has pressed the cover over the optical switch and/or to determine if a malfunction exists in the optical sensor.

16. A domestic appliance according to claim 15 wherein the radiation emitter generates a safety signal which reproduces at least in part the control pulse (Pc) generated by the controller, the controller configured to receive and evaluate the safety signal to determine if a malfunction exists in the optical sensor.

17. A domestic appliance according to claim 15 wherein the radiation received by the radiation receiver from the radiation emitter is reflected from the cover and/or a finger of a user and wherein the radiation received by the radiation receiver from the auxiliary radiation emitter is received directly from the auxiliary radiation emitter.

18. A domestic appliance comprising:
an optical sensor comprising a radiation emitter, an auxiliary radiation emitter, a radiation receiver and an auxiliary radiation receiver, the radiation receiver and auxiliary radiation receiver each adapted to receive at least part of the radiation emitted by the radiation emitter and at least part of the radiation emitted by the auxiliary radiation emitter, the radiation receiver configured to generate one or more reception signals whose values depend on the radiation received, the auxiliary radiation receiver configured to generate one or more reception signals whose values depend on the radiation received,
a cover positioned over the optical sensor, and
a controller configured to generate a periodic control pulse (Pc) at a first time interval to cause the radiation emitter to emit radiation for a duration of time and to generate a periodic test pulse (Pt) at a second time interval different than the first time interval to cause the auxiliary radiation emitter to emit radiation for a duration of time, the controller configured to receive and evaluate the one or more reception signals to determine if a user has pressed the cover over the optical switch and/or to determine if a malfunction exists in the optical sensor.

19. A domestic appliance according to claim 18 wherein the radiation emitter generates a first safety signal which reproduces at least in part the control pulse (Pc) generated by the controller and wherein the auxiliary radiation emitter generates a second safety signal which reproduces at least in part the test pulse (Pt) generated by the controller, the controller configured to receive and evaluate the first and second safety signals to determine if a malfunction exists in the optical sensor.

20. A domestic appliance according to claim 18 wherein the radiation received by the radiation receiver from the radiation emitter is reflected from the cover and/or a finger of a user and wherein the radiation received by the radiation receiver from the auxiliary radiation emitter is received directly from the auxiliary radiation emitter and wherein the radiation received by the auxiliary radiation receiver from the auxiliary radiation emitter is reflected from the cover and/or a finger of a user and wherein the radiation received by the auxiliary radiation receiver from the radiation emitter is received directly from the radiation emitter.

* * * * *